United States Patent
Potocek et al.

(10) Patent No.: US 10,002,742 B2
(45) Date of Patent: Jun. 19, 2018

(54) COMPOSITE SCAN PATH IN A CHARGED PARTICLE MICROSCOPE

(71) Applicant: FEI Company, Hillsboro, OR (US)

(72) Inventors: Pavel Potocek, Eindhoven (NL); Cornelis Sander Kooijman, Veldhoven (NL); Hendrik Jan de Vos, Eindhoven (NL); Hendrik Nicolaas Slingerland, Venlo (NL)

(73) Assignee: FEI Company, Hillsboro, OR (US)

( * ) Notice: Subject to any disclaimer, the term of this patent is extended or adjusted under 35 U.S.C. 154(b) by 0 days. days.

(21) Appl. No.: 14/925,732

(22) Filed: Oct. 28, 2015

(65) Prior Publication Data

US 2016/0118219 A1    Apr. 28, 2016

(30) Foreign Application Priority Data

Oct. 28, 2014  (EP) .................................. 14190703

(51) Int. Cl.
    *H01J 37/28*   (2006.01)
    *H01J 37/26*   (2006.01)
(52) U.S. Cl.
    CPC ............ *H01J 37/28* (2013.01); *H01J 37/265* (2013.01); *H01J 2237/15* (2013.01); *H01J 2237/24495* (2013.01)
(58) Field of Classification Search
    CPC ...... H01J 2237/15; H01J 37/265; H01J 37/28; H01J 2237/202; H01J 37/261; H01J 37/268; H01J 2237/24495; H01J 37/244; H01J 2237/244
    See application file for complete search history.

(56) References Cited

U.S. PATENT DOCUMENTS

| | | | | |
|---|---|---|---|---|
| 3,914,608 | A * | 10/1975 | Malmberg | H01J 37/1475 250/311 |
| 4,136,285 | A * | 1/1979 | Anger | H01J 37/302 250/398 |
| 8,907,280 | B1 * | 12/2014 | Larson | G01N 23/225 250/307 |
| 8,933,401 | B1 * | 1/2015 | Reed | H01J 37/28 250/306 |
| 2003/0085355 | A1 * | 5/2003 | Kohama | G01N 23/2251 250/310 |
| 2003/0160191 | A1 | 8/2003 | Kazuhiro et al. | |

(Continued)

OTHER PUBLICATIONS

"Electron Microscope", Wikipedia, Accessed Oct. 15, 2015, 11 pages. <https://en.wikipedia.org/wiki/Electron_microscope>.

(Continued)

*Primary Examiner* — Wyatt Stoffa
(74) *Attorney, Agent, or Firm* — Scheinberg & Associates, P.C.; Michael O. Scheinberg (57) ABSTRACT

The invention relates to a scanning-type charged particle microscope and a method for operation of such a microscope. Disclosed is a novel scanning strategy to the raster scan or serpentine scan. In some embodiment, the beam scanning motion is separated into short-stroke and long-stroke movements, to be assigned to associate short-stroke and long-stroke scanning devices, which may be beam deflectors or stage actuators. The scan strategy which is less susceptible to effects such as overshoot, settling/resynchronization, and "backlash" effects.

15 Claims, 6 Drawing Sheets

(56) References Cited

U.S. PATENT DOCUMENTS

| | | | | |
|---|---|---|---|---|
| 2008/0073528 A1* | 3/2008 | Sasaki | ............... | H01J 37/265 250/307 |
| 2009/0230304 A1* | 9/2009 | Hatano | ............... | H01J 37/244 250/311 |
| 2009/0242761 A1* | 10/2009 | Yeh | ............... | H01J 37/20 250/307 |
| 2011/0174975 A1* | 7/2011 | Sasaki | ............... | H01J 37/265 250/310 |
| 2013/0015351 A1* | 1/2013 | Kooijman | ............... | G01N 23/2206 250/307 |

OTHER PUBLICATIONS

"Scanning Electron Microscope", Wikipedia, Accessed Oct. 15, 2015, 18 pages. <https://en.wikipedia.org/wiki/Scanning_electron_microscope>.

"Transmission Electron Microscopy", Wikipedia, Accessed Oct. 15, 2015, 23 pages. <https://en.wikipedia.org/wiki/Transmission_electron_microscopy>.

"Scanning Transmission Electron Microscopy", Wikipedia, Accessed Oct. 15, 2015, 5 pages. <https://en.wikipedia.org/wiki/Scanning_transmission_electron_microscopy>.

"Scanning Helium Ion Microscope", Wikipedia, Accessed Oct. 15, 2015, 2 pages. <https://en.wikipedia.org/wiki/Scanning_Helium_Ion_Microscope>.

W. H. Escovitz et al., "Scanning Transmission Ion Microscope with a Field Ion Source", Proc. Nat. Acad. Sci. USA, vol. 72, No. 5, pp. 1826-1828, May 1975, 3 pages.

"Space-Filling Curve", Wikipedia, Accessed Oct. 28, 2015, 6 pages. <https://en.wikipedia.org/wiki/Space-filling_curve>.

Hilbert Curve, Wikipedia, Accessed Oct. 28, 2015, 6 pages. <https://en.wikipedia.org/wiki/Hilbert_curve>.

"Moore Curve", Wikipedia, Accessed Oct. 28, 2015, 3 pages. <https://en.wikipedia.org/wiki/Moore_curve>.

"Z-Order Curve", Wikipedia, Accessed Oct. 28, 2015, 6 pages. <https://en.wikipedia.org/wiki/Z-order_curve>.

"Peano Curve", Wikipedia, Accessed Oct. 28, 2015, 2 pages. <https://en.wikipedia.org/wiki/Peano_curve>.

Herman Haverkort, "Recursive Tilings and Space-Filling Curves with Little Fragmentation", arXiv:1002.1843v1 [cs.CG], Feb. 9, 2010, 28 pages.

"Math-Planepath", GPLv3, Accessed Oct. 28, 2015, 3 pages. <http://user42.tuxfamily.org/math-planepath/>.

* cited by examiner

COMPOSITE SCAN PATH IN A CHARGED PARTICLE MICROSCOPE

The invention relates to a scanning-type Charged Particle Microscope, comprising:
- A specimen holder, for holding a specimen;
- A source, for producing a beam of charged particles;
- An illuminator, for directing said beam so as to irradiate the specimen;
- A detector, for detecting a flux of radiation emanating from the specimen in response to said irradiation;
- Scanning means, for producing relative scanning motion of the beam and specimen so as to cause the beam to trace out a scan path on the specimen;
- A programmable controller that can be invoked to execute at least one automated procedure in the microscope.

The invention also relates to various methods of using such a Charged Particle Microscope.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
- http://en.wikipedia.org/wiki/Electron_microscope
- http://en.wikipedia.org/wiki/Scanning_electron_microscope
- http://en.wikipedia.org/wiki/Transmission_electron microscopy
- http://en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:
- http://en.wikipedia.org/wiki/Scanning_Helium_Ion_Microscope
- W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

It should be noted that, in addition to imaging, a charged particle microscope may also have other functionalities, such as performing spectroscopy, examining diffractograms, performing (localized) surface modification (e.g. milling, etching, deposition), etc.

In all cases, a scanning-type Charged Particle Microscope (CPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect the desired scanning motion of the beam w.r.t. the specimen. In general, such a specimen holder will be connected to a positioning system such as a mechanical stage.
- A detector (for detecting radiation emanating from an irradiated specimen), which may be unitary or compound/distributed in nature, and which can take many different forms, depending on the radiation being detected. Examples include photomultipliers (including solid-state photomultipliers, SSPMs), photodiodes, CMOS detectors, CCD detectors, photovoltaic cells, etc., which may, for example, be used in conjunction with a scintillator film, for instance.
- Scanning means, for producing relative scanning motion of the radiation beam and the specimen, thereby causing the beam to trace out a pre-determined (two-dimensional) scan path on (a presented surface of) the specimen. An image is then constructed on the basis of detector output per sampling point on the scan path, thus constructing a (two-dimensional) map of said specimen (surface). As alluded to above, such scanning means may, for example, be based on beam (scanning) deflection or holder (scanning) motion.
- A programmable controller (computer processor) for regulating operation of the microscope and/or executing control commands (e.g. as enshrined in software, generally supplemented/modified by input from a user interface and signals from sensors).

In what follows, the invention may—by way of example—sometimes be set forth in the specific context of electron microscopy. However, such simplification is intended solely for clarity/illustrative purposes, and should not be interpreted as limiting.

An example of a microscope as set forth in the opening paragraph above is a SEM, for instance. Another example is a STEM. In such tools, a relatively narrow charged-particle beam (sometimes called a "probe") is scanned over a presented surface of a specimen, and the employed detector constructs a pixel-by-pixel image of said surface (on the basis of detector output as a function of coordinate position on the surface). To this end, it is conventional to employ a so-called "raster" scan path, whereby, for example:
- An $n^{th}$ scan line is scanned from left to right parallel to (say) the +X direction of a Cartesian coordinate system;
- At the end of this $n^{th}$ scan line, a fast retrace/flyback is made in the −X direction, after which a small incremental step is made in the Y direction;
- Thereafter, an $(n+1)^{th}$ scan line is scanned from left to right parallel to +X;
- And so forth, in consecutive iterations.

However, this approach has disadvantages, inter alia since the fast retrace/flyback necessarily incurs a certain overshoot and attendant settling/re-synchronization time (during which the beam is generally blanked), thus causing a throughput penalty.

In an attempt to circumvent this problem, one can instead try a (bidirectional) "serpentine" variant of the (unidirectional) raster scan, whereby:
- An $n^{th}$ scan line is scanned from left to right parallel to +X;
- At the end of this $n^{th}$ scan line, a small incremental step is made in the Y direction;
- Thereafter, an $(n+1)^{th}$ scan line is scanned from right to left parallel to −X;
- And so forth, in consecutive iterations.

However, a problem with such a serpentine scan is that, at the end of each scan line, a complete reversal of scan direction is required. Since the scan line is relatively long (i.e. has a relatively large amplitude, in that it covers the full width of the scanned surface in the X direction), it provides an opportunity to attain relatively high scan speeds. If direction reversal occurs at such high scan speeds, a relatively large "backlash effect" will ensue, which may, for example, manifest itself as follows:
- If scanning motion is based on magnetic beam deflection (using current-carrying coils), then relatively large and fast voltage excursions will be needed to change the current direction through the employed deflector(s). Such voltage changes will effectively be rendered impossible by impedance effects (which scale with the rate of voltage change) or power supply voltage limitations. To combat this, one could seek to reduce impedance, e.g. by using thicker coil wires or employing superconducting coils, but such solutions tend to be (repulsively) cumbersome and expensive.
- In the case of electrostatic beam deflection (using capacitive plates), relatively large and fast current changes will be needed to alter the voltage on the employed deflector(s). Once again, impedance effects or power supply current limitations effectively disallow such changes in practical situations.
- If scanning motion relies on specimen holder displacement (using mechanical actuators), then relatively large reaction forces/jerks will be entailed in reversing the displacement direction. If untreated, these will lead to parasitic vibrations in the microscope. To prevent this, relatively complex reaction force mitigation mechanisms (such as use of reactive balance masses, compensatory frame actuation, etc.) will need to be considered.

As a result of these "backlash" effects—and the relatively unattractive countermeasures needed to mitigate them—one is basically forced to decelerate the line scan gradually to zero velocity before making a direction change. Consequently, a line scan in this instance will generally comprise:
- A pre-scan, accelerative or run-up portion, from velocity zero to velocity v, of length L1;
- A mid-scan, constant-speed portion at velocity v, of length L2;
- A post-scan, decelerative or run-down portion, from velocity v to velocity zero, of length L3 (which may or may not be equal to L1).

This scenario is relatively complex and inefficient. In addition, such measures do not address the so-called "zipper effect", which is a (slight) line-to-line misalignment caused by intrinsic beam position delay/data lag issues associated with bidirectional scanning.

Although set-ups such as those set forth in the previous paragraph have produced tolerable results up to now, the current inventors have worked extensively to substantially improve such conventional designs. The results of this endeavor are the subject of the current invention.

It is an object of the invention to provide an improved charged particle microscope as referred to above. In particular, it is an object of the invention that such a microscope should employ an alternative scanning strategy to the raster scan/serpentine scan known from the prior art. Moreover, it is an object of the invention that the improved microscope design should be less susceptible to effects such as the overshoot, settling/re-synchronization, and "backlash" effects described above.

These and other objects are achieved in a charged particle microscope as set forth in the opening paragraph above, characterized in that:
Said scanning means comprise:
- Long-stroke scanning means, for effecting scanning motion of relatively large amplitude and relatively low frequency;
- Short-stroke scanning means, for effecting scanning motion of relatively small amplitude and relatively high frequency;
Said controller can be invoked to trace out a scan path comprising relatively small-amplitude movements, performed using said short-stroke scanning means, that combine into a resultant relatively large-amplitude migration, achieved with the aid of said long-stroke scanning means.

In this context, it should be noted that:
The complementary phrases "relatively small" and "relatively large" should be interpreted relative to one another, without necessarily having to be compared to an external absolute reference. The same applies to the complementary phrases:
"relatively low" and "relatively high";
"long-stroke" and "short-stroke".
The skilled artisan will readily understand such mutually comparative terms.
The term "migration" should be interpreted as referring to the (extremal dimensions of the) finished scan path as a whole, rather than to a particular temporal "snapshot" of scanning beam position. Consequently, the beam might (for example) start and finish at (approximately) the same location (origin), though after having made an intervening migration to a region (or multiple regions) relatively distal from that location (when referenced to the size of said small-amplitude movements).

The crux of the current invention can be set forth as follows. A conventional raster scan/serpentine scan can be regarded as involving a "single stroke" approach, in that pixel positions on the specimen surface are visited by using long, broad, essentially continuous sweeps in straight lines. In contrast, the current invention can be regarded as entailing a "dual stroke" approach, whereby:

Said short-stroke scanning means produce relatively fast, short-range excursions relative to a barycenter (or, alternatively, an origin/reference point);

Said long-stroke scanning means essentially move said barycenter in a relatively slow, long-range migration across the specimen surface.

Such a scenario can be described as a "piggyback" approach, since the barycenter of the short-stroke excursions "rides piggyback" on the long-stroke migration. It can also be regarded as a "split task" approach, because different (relatively incompatible) tasks—namely high-speed movement and large-amplitude movement—are each carried out by dedicated, specialized/optimized scanning means. Accordingly:

High-speed, high-accuracy motion is conducted by the short-stroke scanning means, at the expense of amplitude;

This lack of amplitude is made up for by the use of the long-stroke scanning means, which provide much greater reach. They can, in principle, do this at the expense of speed and accuracy, since these requirements are addressed by the short-stroke scanning means.

Such task "bifurcation" allows each of the short-stroke and long-stroke scanning means to be individually embodied/optimized as regards structure and performance. Other advantages of the invention include the following:

Because scanning functionality is separated into long-stroke/short-stroke components, scanning parameters can also be split up into sub-parameters associated specifically with the long-stroke/short-stroke scanning means. This allows greater/finer scanning control/set-up.

Composite/bifurcated long-stroke/short-stroke scanning tends to result in more evenly distributed bandwidth requirements for (Cartesian) X and Y deflection (or Polar r, θ deflection, for example).

Deflection non-linearities/imperfections associated with the short-stroke scanning means will characteristically result in (repetitive) small-scale/local distortions rather than more global scan path deformation, and the former can relatively easily be compensated for by suitably lowering acquisition/sampling resolution.

In a particular embodiment of the invention, the following applies:

Each of said long-stroke and said short-stroke scanning means is selected from the group comprising electrostatic field deflectors, magnetic field deflectors and combinations hereof;

Said scan path is achieved by superimposing relatively small-amplitude first field deflections upon relatively large-amplitude second field deflections, and subjecting said beam to these superimposed deflections.

For example, in a specific instance of such an embodiment:

The short-stroke scanning means can comprise electrostatic deflectors (capacitor plates), which tend to be fast and accurate for relatively small deflections;

The long-stroke scanning means can comprise magnetic deflectors (coils), which lend themselves more to relatively large/slow deflections.

These deflectors may be arranged in series (one after the other) or in nested/coincident arrangement (one within the other), so that each may exert its influence on a charged-particle beam passing through them; the result is that such a beam experiences a superposition (sum/resultant) of the deflections caused by each of the scanning means individually. In the case of a series arrangement, the electrostatic (E) and magnetic (M) deflectors preferably have (substantially) the same pivot point—which can, for example, be achieved by using an M-E-M or E-M-E configuration (with split M or E functionality, respectively). In the case of a nested arrangement of, for example, E within M, one should preferably choose the metal plates of the inner E deflector to have not too low a resistivity value, so as to avoid excessive eddy current generation therein by the coils of the outer M deflector. The skilled artisan will be able to fully grasp/adopt such considerations.

Of course, the specific instance discussed above is not limiting, and one could instead choose other role assignments of (different or same types of) deflectors. For example, the short-stroke scanning means could comprise relatively small (fast-response) deflector coils and the long-stroke scanning means could comprise relatively large (slow-response) deflector coils.

In an alternative embodiment, the following applies:

One of said long-stroke and said short-stroke scanning means is selected from the group comprising electrostatic field deflectors, magnetic field deflectors and combinations hereof;

The other of said long-stroke and said short-stroke scanning means comprises a mechanical actuator for moving the specimen holder;

Said scan path is achieved by a combination of beam deflection and specimen holder movement.

In this embodiment, the role of short-stroke and long-stroke scanning is delegated/divided between beam deflection on the one hand and specimen holder (stage) movement on the other hand. For example, in a specific instance of such an embodiment:

The short-stroke scanning means can comprise electrostatic deflectors (capacitor plates), which tend to be fast and accurate for relatively small deflections;

The long-stroke scanning means can comprise a stage actuator (such as a linear motor, stepper motor, pneumatic actuator, hydraulic actuator, etc.), which lends itself more to relatively large/slow deflections.

In such an embodiment, the mechanical actuator ensures that different (long-stroke-separated) areas of the specimen can be brought within reach of the (short-stroke) beam deflectors.

Of course, the specific instance discussed above is not limiting, and one could instead choose an opposite role assignment, whereby (for example):

The short-stroke scanning means comprise a relatively small (fast-response) actuator, such as a voice coil motor or piezoelectric actuator, for instance;

The long-stroke scanning means comprise relatively large (slow-response) deflector coils.

The skilled artisan will understand that the embodiments set forth in the previous two paragraphs are non-limiting and that, for example, it is also possible to embody both the long-stroke and the short-stroke scanning means to comprise (different or similar types of) mechanical actuators. He will also understand that, for example, one could, in principle, displace the beam by displacing a beam defining aperture (e.g. using a piezoelectric stage) through which the beam passes.

Whereas the scan path followed in a conventional raster scan/serpentine scan is a relatively simple, repetitive back-and-forth trace, the scan path attendant to the current invention can be much more "exotic". In this regard, in a particular embodiment of the invention, the scan path is (substantially) executed as a (mathematical) space-filling curve, particularly one selected from the group comprising a serpentine curve, a Hilbert curve, a Moore curve, a Z-order curve, a H-order curve, a Peano curve, an $AR^2W^2$ curve, a $\beta\Omega$ curve, and combinations hereof. Such (mathematically-generated) curves achieve (ultimate) relatively large-amplitude displacement as a resultant sum of many constituent small-amplitude steps. Hilbert and Moore curves, for example, also have the advantageous property that they can fill a plane with a potentially infinite-resolution curve; therefore, by selecting a suitable (average) box/cell filter for an acquisition (sampling) scan path, one can choose the acquisition resolution independently of other scan path parameters. Another advantage of a Moore curve (and other so-called "closed curves") is that its start and finish points are (substantially) adjacent; consequently, at the end of a scan path, the net deflection of the inventive long-stroke scanning means can be essentially the same as it was at the start of the scan path, which means that the "reset step" necessary to get back to the start point from the finish point—so as to scan a subsequent frame—is zero or relatively small.

For more information on (some of the) specific curve types mentioned here, reference is made to the following links:
 http://en.wikipedia.org/wiki/Space-filling_curve
 http://en.wikipedia.org/wiki/Hilbert_curve
 http://en.wikipedia.org/wiki/Moore_curve
 http://en.wikipedia.org/wiki/Z-order_curve
 http://en.wikipedia.org/wiki/Peano_curve
 http://arxiv.org/pdf/1002.1843.pdf
 http://user42.tuxfamily.org/math-planepath/

In a particular embodiment of the invention, the scan path is a sparse scan path. Sparse scanning is a technique whereby, instead of visiting all possible pixel (box/cell) positions along a specimen-filling scan path, one instead only visits a relatively sparse set of such positions. Such a scanning technique (also referred to as "compressive sensing") is advantageous in that it is necessarily (much) faster than a full scan, and entails much less radiation exposure of the specimen. The current invention allows an optimal scan path to be calculated/followed so as to efficiently visit a given sparse set of sampling points, and can (if necessary) adjust/tweak the locations of certain members of such a set so as to optimize said scan path. More information on (diverse) sparse scanning techniques in CPM imaging can, for example, be gleaned from European Patent Application EP 14172871.7.

In another embodiment of the present invention, use is made of:
 A first detector with a relatively long characteristic response time, matched to a relatively low sampling frequency of the long-stroke scanning means;
 A second detector with a relatively short characteristic response time, matched to a relatively high sampling frequency of the short-stroke scanning means,
which first and second detectors can be concurrently deployed to detect said radiation flux while said scan path is being traced out. As already set forth above, the flux of radiation emanating from the specimen in response to irradiation with a charged-particle beam will typically comprise many different radiation species—such as backscattered electrons, secondary electrons, cathodoluminescence and X-rays—and these different radiation species are generally detected using different types of detectors, which will typically have different response times (determined, inter alia, by phenomena such as quenching, dead time, refresh behavior, etc.). Moreover, the physical mechanisms generating these different radiation species also have different characteristic time constants; for example, cathodoluminescence is produced with a certain intrinsic delay (excitation and de-excitation time) relative to, say, backscattered electron emission. Conventionally, the scan speed (sampling/acquisition rate) has to be adjusted to suit the slowest detector/generation mechanism being used, so as to avoid signal smearing. However, because the current invention splits scanning behavior into complementary high-frequency and low-frequency components, it becomes possible to use separate detectors/generation mechanisms—with substantially different response times/characteristic time constants—to (concurrently) follow these different-frequency components. More specifically, a relatively fast detector/generation mechanism (e.g. a photodiode/backscattered electron emission) can be matched to the relatively fast short-stroke scanning motion (with a relatively high pixel rate), and a relatively slow detector (e.g. a solid state drift detector/cathodoluminescence) can be (concurrently) matched to the relatively slow long-stroke scanning motion (with a relatively low pixel rate). In this way, it becomes possible to efficiently concurrently assemble, for example, a (relatively fast) backscattered electron image and a (relatively slow) cathodoluminescence image—although, per frame, the image from the slow detector/generation mechanism will be assembled with fewer pixels than that from the fast detector/generation mechanism.

Regarding an embodiment as discussed in the previous paragraph, it can be particularly advantageous (e.g. when tracing/scanning a space-filling curve such as a Moore curve) if the respective response times (inverse detection speeds) T1 and T2 of the first and second detectors satisfy the relationship:

$$T1/T2 \sim 4^n$$

where n is a non-negative integer. So, in other words, the ratio T1/T2 preferably has a value chosen from the sequence 1, 4, 16, 64, etc. In that way (assuming satisfactory initial synchronization), the "super-pixels" seen by the relatively slow first detector will be squares that are 2n×2n times larger than the pixels seen by the relatively fast second detector—a fact that matches efficiently/intrinsically to the manner in which a Moore curve (or other space-filling curve) migrates across a surface.

In the context of the current invention, the CPM's programmable controller can, for example, perform tasks such as the following:
 Accept—as input from a user interface, such as a keyboard or touchscreen, for example—parameters such as desired resolution/desired sparsity of the sampling set, specific area of the specimen to be scanned, etc.
 Calculate/determine a scan path to be traced out on said area of the specimen, with said resolution/sparsity. Such a path may, for example, follow a known type of mathematical space-filling curve, or it may be a more case-specific type of path.
 Deconvolve/separate said scan path into complementary long-stroke and short-stroke contributions, and determine associated motions to be assigned to attendant long-stroke and short-stroke scanning means.
 Generate a series of setpoints for said long-stroke and short-stroke scanning means, so as to cause them (in combination) to trace out the desired scan path.

The invention will now be elucidated in more detail on the basis of exemplary embodiments and the accompanying schematic drawings, in which.

In the Figures, where pertinent, corresponding parts may be indicated using corresponding reference symbols.

EMBODIMENT 1

Figure 1:
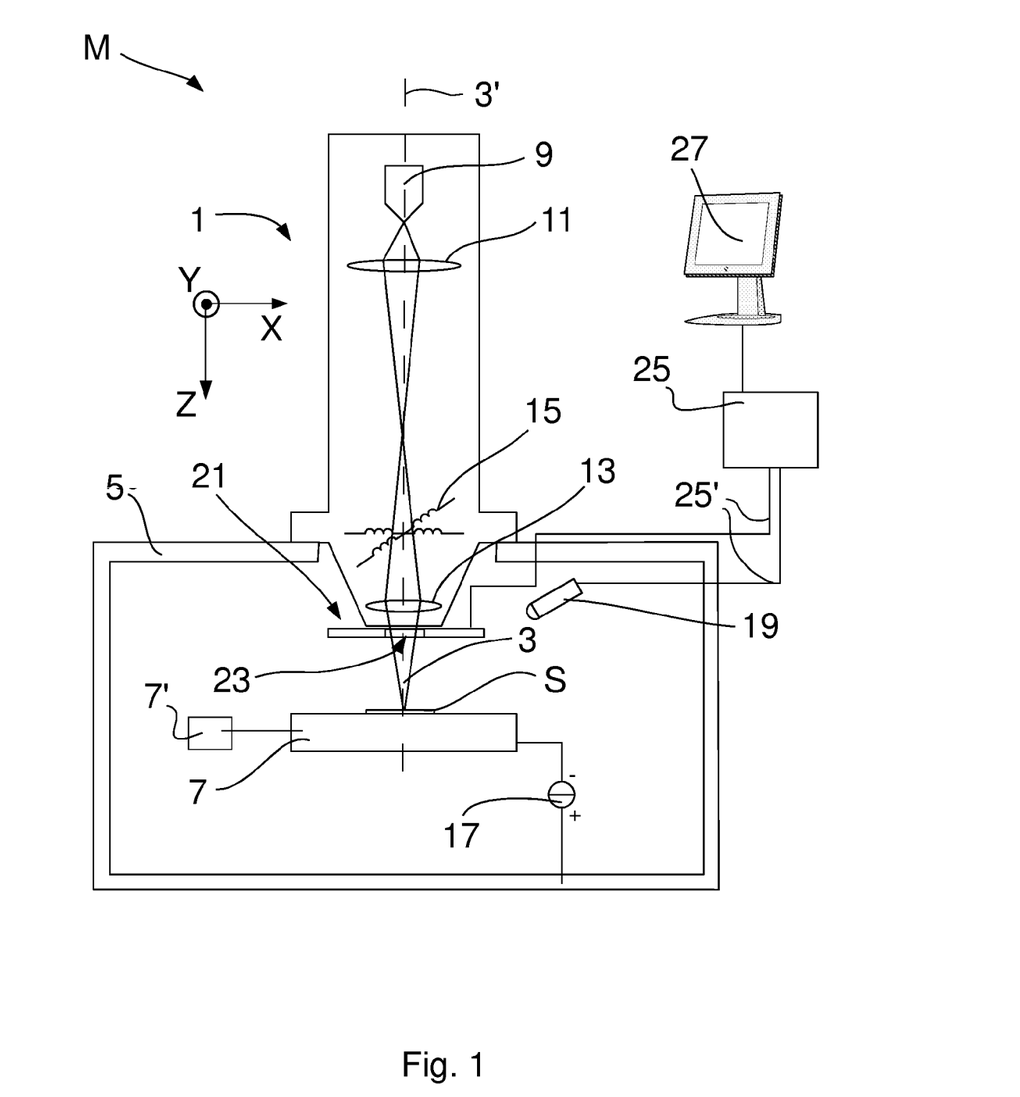
FIG. 1 renders a cross-sectional view of an embodiment of a scanning-type charged particle microscope according to the present invention.

FIG. 1 is a highly schematic depiction of an embodiment of a CPM according to the present invention; more specifically, it shows an embodiment of a scanning-type microscope M, which, in this case, is a SEM (though, in the context of the current invention, it could just as validly be an ion-based microscope, for example). The microscope M comprises a particle-optical column/illuminator 1, which produces a beam 3 of input charged particles (in this case, an electron beam) that propagates along a particle-optical axis 3'. The particle-optical column 1 is mounted on a vacuum chamber 5, which comprises a specimen holder 7 and associated stage/actuator 7' for holding/positioning a specimen S. The vacuum chamber 5 is evacuated using vacuum pumps (not depicted). With the aid of voltage source 17, the specimen holder 7, or at least the specimen S, may, if desired, be biased (floated) to an electrical potential with respect to ground.

The particle-optical column 1 comprises an electron source 9 (such as a Schottky gun), lenses 11, 13 to focus the electron beam 3 onto the specimen S, and a deflection unit 15 (to perform beam steering/scanning of the beam 3). The apparatus M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of output radiation flux emanating from the specimen S in response to irradiation by the input beam 3. In the apparatus depicted here, the following detector choices have been made:

Detector 19 is an Everhardt Thornley detector that is used to detect (at least a portion of) an output flux of secondary electrons emanating from the specimen S;

Detector 21 is a segmented silicon electron detector, comprising a plurality of independent detection segments (e.g. quadrants) disposed about a central aperture 23 (allowing passage of the beam 3). Such a detector can, for example, be used to investigate the angular dependence of a flux of output (secondary or backscattered) electrons emerging from the specimen S.

As here rendered, both detectors 19 and 21 are used to examine electrons; however, this is purely a design/implementation choice and, if desired, one could also elect to detect other types of output radiation flux emanating from the specimen S (e.g. X-rays, cathodoluminescence) in addition, or as an alternative, to electrons.

By scanning the input beam 3 over the specimen S, output radiation—comprising, for example, a flux of X-rays, infra-red/visible/ultraviolet light, secondary electrons and or backscattered (BS) electrons—emanates from the specimen S. Since such output radiation is position-sensitive (due to said scanning motion), the information obtained from the detectors 19, 21 will also be position-dependent. This fact allows the output of detector 19 (for instance) to be used to produce (for example) a secondary electron image of (part of) the specimen S, which image is basically a map of an output of detector 19 as a function of scan-path position on the specimen S.

The signals from the detectors 19, 21 pass along control lines (buses) 25', are processed by the controller 25, and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

It should be noted that many refinements and alternatives of such a set-up will be known to the skilled artisan, including, but not limited to:

The use of dual beams—for example an electron beam 3 for imaging and an ion beam for machining (or, in some cases, imaging) the specimen S;

The use of a controlled environment at the specimen S—for example, maintaining a pressure of several mbar (as used in a so-called Environmental SEM) or by admitting gases, such as etching or precursor gases, etc. Although the scanning-type microscope shown in FIG. 1 is a SEM, it could, in the context of the current invention, just as validly be a STEM, for example (see Embodiment 3 below).

The current invention concerns the manner in which the beam 3 is scanned with respect to the specimen S, which is held on holder 7 so as to show a presented surface to the beam 3. As already discussed above, relative scanning motion of beam 3 and holder 7 can, in principle, be achieved in two different ways, namely:

By using deflection unit 15 to move the beam 3 relative to the holder 7;

By using stage/actuator 7' to move the holder 7 relative to the beam 3.

Regardless of which of these mechanisms is used, the current invention differs from the prior art in that it achieves scanning motion of the beam 3 relative to the specimen S using a composite long-stroke+short-stroke motion. This concept is explained in more detail in the next Embodiment below. Such composite motion can be automatically achieved by using (for example) the controller 25 to generate complementary control commands for long-stroke and short-stroke scanning means, which may, for example, be embodied as follows:

Long-stroke scanning means: Stage 7', which may, for example, comprise a linear motor. Alternatively, one could make use of long-stroke magnetic deflection coils in deflection unit 15, for instance.

Short-stroke scanning means: Deflection unit 15, which may, for example, comprise electrostatic deflection plates.

The controller 25 can, for example, calculate and issue periodic setpoints to these long-stroke and short-stroke scanning means based on coordinate positions of sampling points on a particular space-filling curve that it desires to use as the ultimate scan path.

EMBODIMENT 2

FIGS. 2A-2G show various aspects of a scan path traced out using an embodiment of the current invention, and particularly illustrate how it is realized using a combination of long-stroke and short-stroke scanning means. More particularly, the content of these various sub-figures can be explained as follows.

Figure 2A:
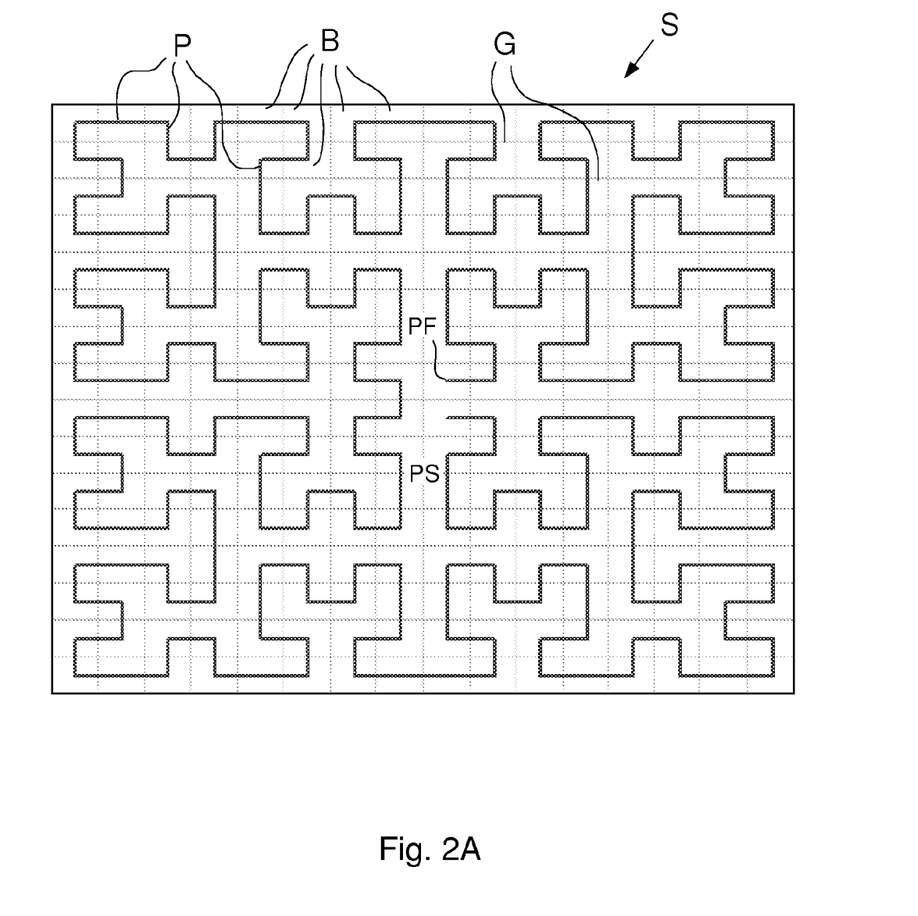
FIGS. 2A-2G show various aspects of a scan path traced out using an embodiment of the current invention, and particularly illustrate how it is realized using a combination of long-stroke and short-stroke scanning means.

FIG. 2A renders a plan view of (part of) a presented surface of a specimen S. Superimposed thereon is an (imaginary) grid G, which divides said surface into an (orthogonal) array of (imaginary) boxes (blocks, cells, units) B. It is the intention that each of these boxes B be visited/sampled by a scanning charged-particle beam (not depicted; see, for example, item 3 in FIG. 1). To this end, relative motion is effected between said beam and the specimen S so as to trace out a scan path P on the specimen S. As here illustrated, scan path P is a Moore curve, with starting point PS and finishing point PF in close proximity to one another. Note that (the center of) each of the boxes B lies on (i.e. is visited by) the scan path P. In accordance with the present invention, such a scan path P can be traced out by using the combined effect of long-stroke and short-stroke scanning means, as will now be explained in more detail.

Figure 2B:
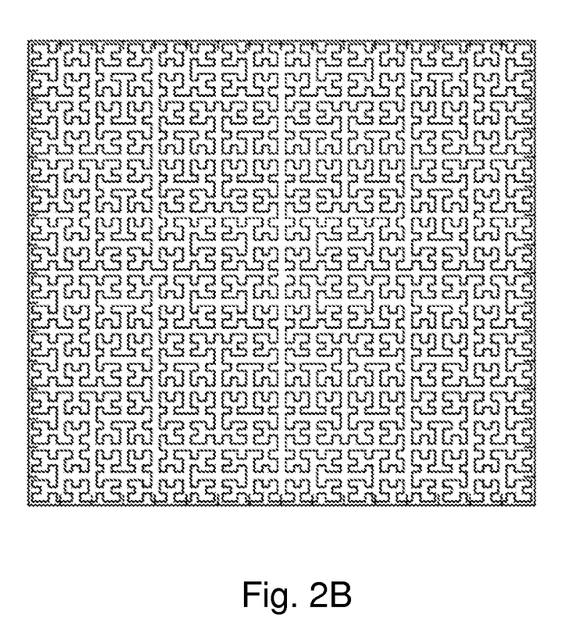

FIG. 2B essentially shows the subject of FIG. 2A, but now zoomed out so as to depict a larger area of the specimen S. To realize the scan path shown in FIG. 2B, complementary FIGS. 2C and 2D respectively show the movements executed by cooperative long-stroke scanning means (FIG. 2C) and short-stroke scanning means (FIG. 2D). More particularly:

Starting with FIG. 2D, it is evident that the short-stroke scanning means have a relatively limited motional reach/amplitude; as here depicted, they have a range of only about 15% of the width/height of FIG. 2B. However, this is not an impediment because, according to the present invention, the associated long-stroke scanning means can be invoked so as to position the motional range of the short-stroke scanning means anywhere within the borders of FIG. 2B.

Figure 2C:
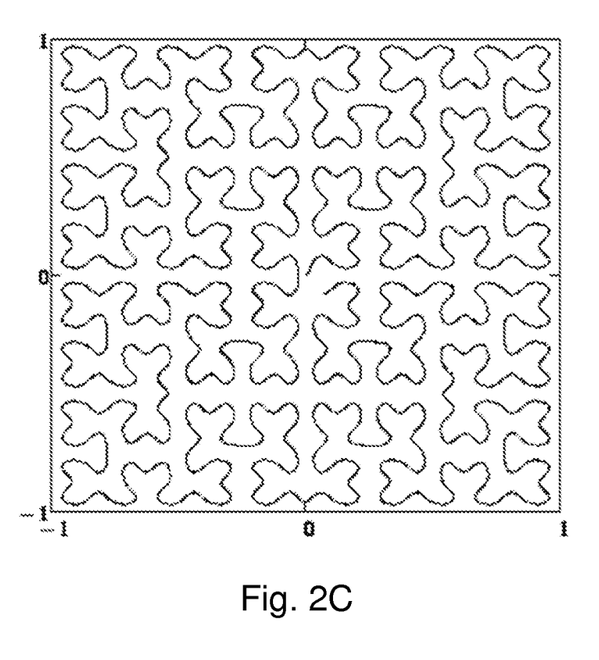
Figure 2D:
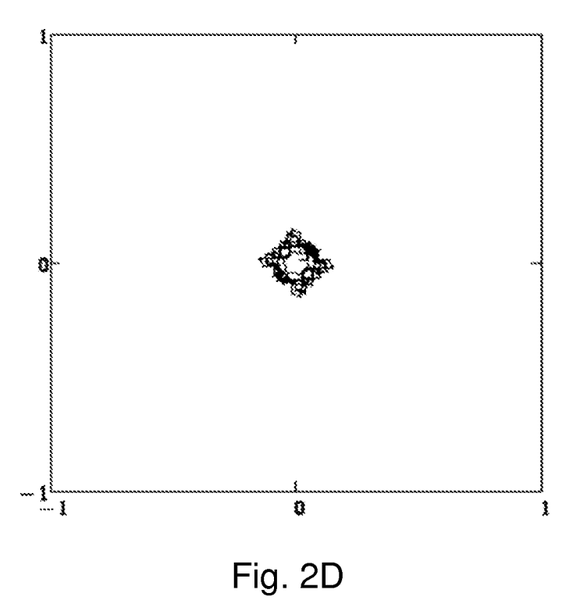
Figure 2E:
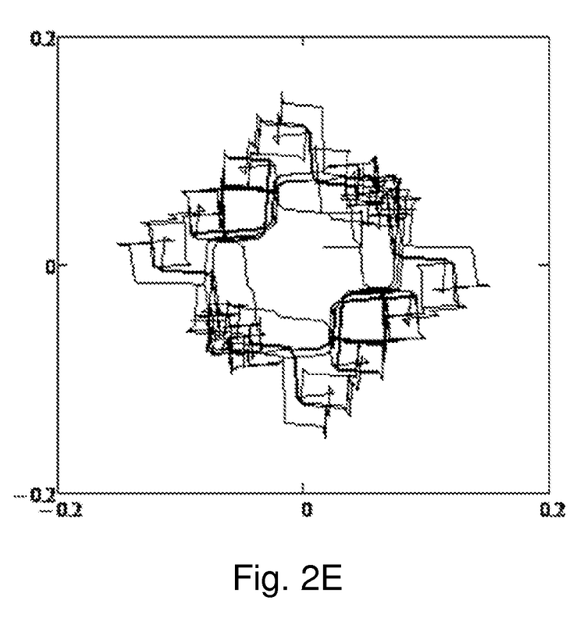

In this context, FIG. 2C shows the tract that is followed by said long-stroke scanning means. Note that the depicted tract has a characteristic cell size/period that is much larger than that of the resultant scan path of FIG. 2B; accordingly, the long-stoke scanning means can be regarded as performing a relatively "low-frequency" (LF) motion. Superimposed on this LF motion, the short-stroke scanning means make relatively "high-frequency" (HF) excursions. These are more clearly visible in FIG. 2E, which is a 5× magnified (and zoomed in) version of FIG. 2D.

Figure 2F:
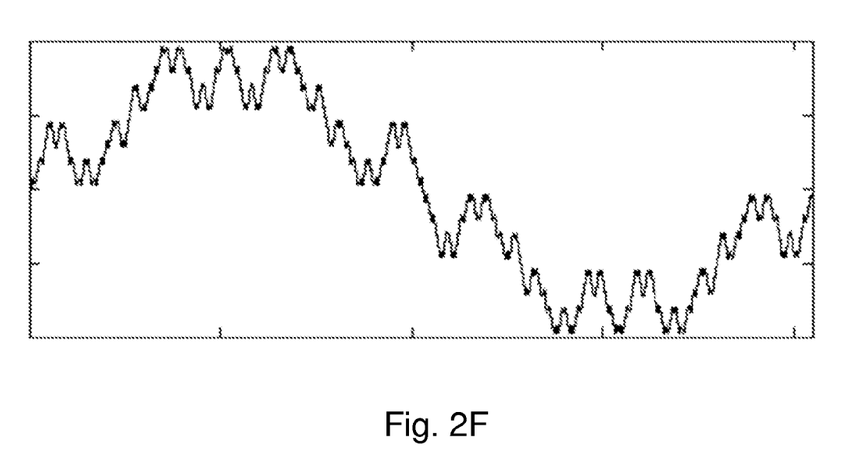
Figure 2G:
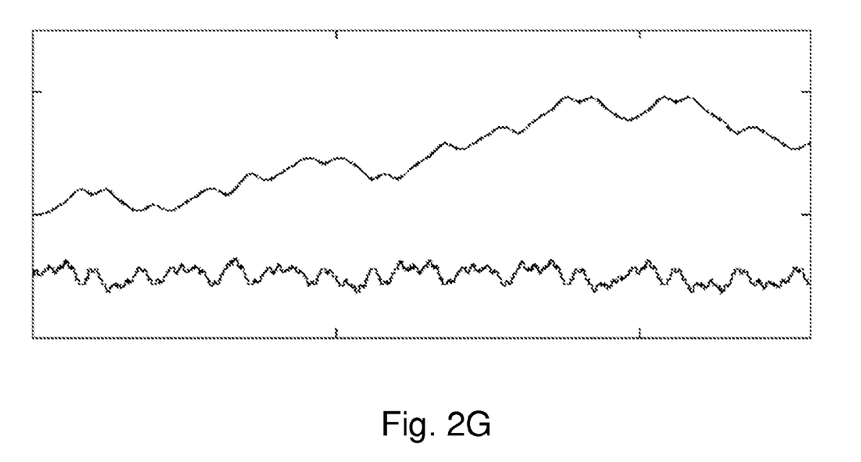

This complementary bifurcation of tasks is also illustrated in FIGS. 2F and 2G, which depict command (setpoint) signals (to the scanning means) associated with the scan path of FIG. 2B. More particularly:

FIG. 2F shows the resultant/cumulative/net command signal associated with the scan path of FIG. 2B. Note that it comprises HF excursions superimposed upon an LF "carrier" waveform.

In FIG. 2G, these HF and LF components have been separated so as to more clearly illustrate them. The upper (LF) signal in FIG. 2G corresponds to the long-stroke tract of FIG. 2C, whereas the lower (HF) signal in FIG. 2G corresponds to the short-stroke tract of FIGS. 2D/2E.

The signals in FIGS. 2F, 2G may, for example, represent the driving voltages/currents to magnetic deflecting coils, electrostatic deflector plates or mechanical stage actuators, for example.

EMBODIMENT 3

Figure 3:
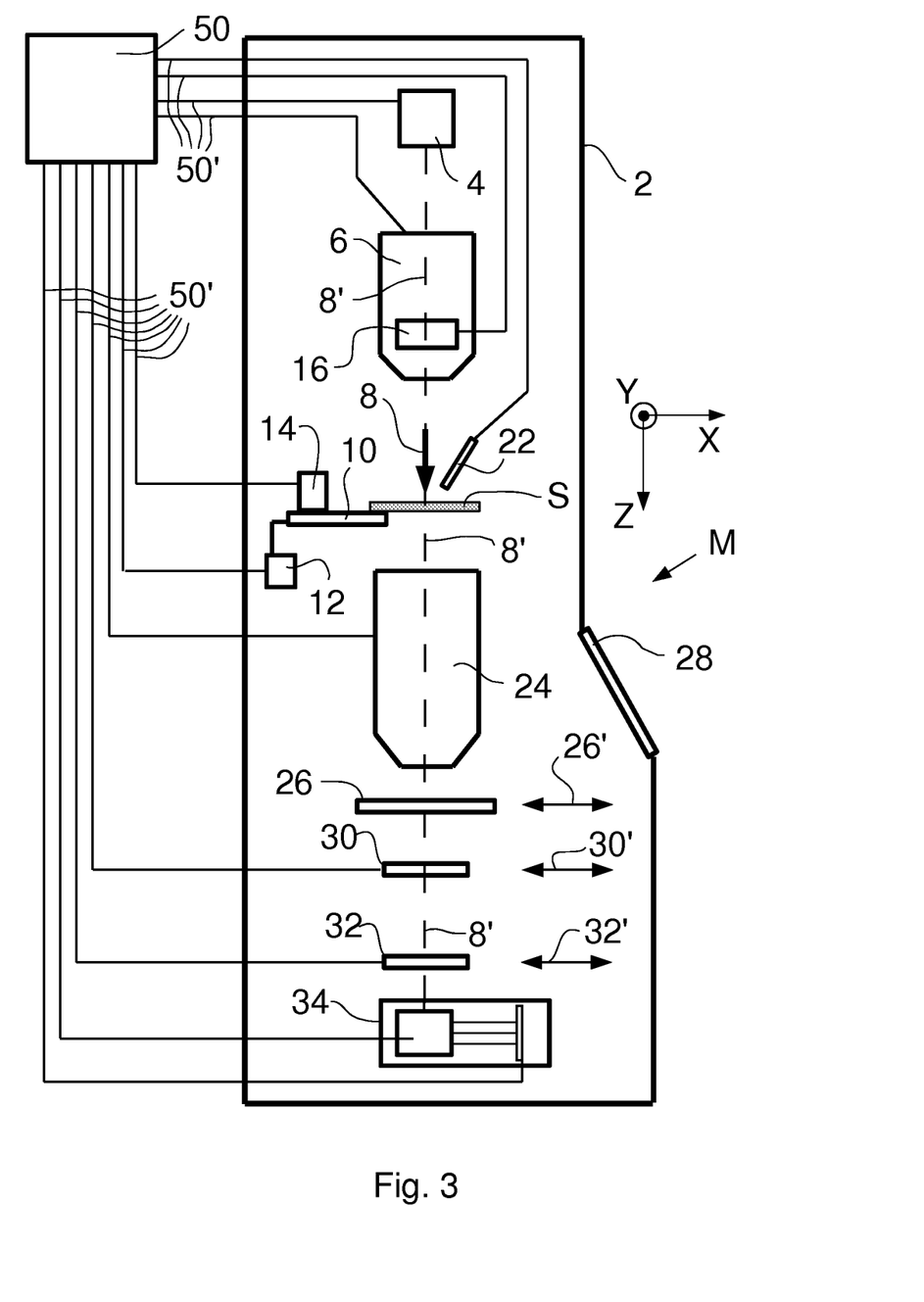
FIG. 3 renders a cross-sectional view of an embodiment of a transmission-type charged particle microscope, usable in scanning mode according to the present invention.

FIG. 3 is a highly schematic depiction of an embodiment of another CPM according to the current invention; more specifically, it shows an embodiment of a transmission-type microscope M, which, in this case, is a TEM/STEM (though, in the context of the current invention, it could just as validly be an ion-based microscope, for example). In the Figure, within a vacuum enclosure 2, an electron source 4 (such as a Schottky gun, for example) produces a beam (8) of electrons that traverse an electron-optical illuminator 6, serving to direct/focus them onto a chosen part of a specimen S (which may, for example, be (locally) thinned/planarized). This illuminator 6 has an electron-optical axis 8', and will generally comprise a variety of electrostatic/magnetic lenses, (scan) deflector(s) 16, correctors (such as stigmators), etc.; typically, it can also comprise a condenser system (the whole of item 6 is sometimes referred to as "a condenser system").

The specimen S is held on a specimen holder 10 that can be positioned in multiple degrees of freedom by a positioning device (stage) 12; for example, the specimen holder 10 may comprise a finger that can be moved (inter alia) in the XY plane (see the depicted Cartesian coordinate system; typically, motion parallel to Z and tilt about X/Y will also be possible). Such movement allows different parts of the specimen S to be irradiated/imaged/inspected by the electron beam traveling along axis 8' (in the Z direction) (and/or allows scanning motion to be performed, as an alternative to beam scanning). An optional cooling device 14 is in intimate thermal contact with the specimen holder 10, and is capable of maintaining the latter at cryogenic temperatures, e.g. using a circulating cryogenic coolant to achieve and maintain a desired low temperature.

The (focused) electron beam 8 traveling along axis 8' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis 8'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis 8'. An image (or diffractogram) of (part of) the specimen S will be formed by imaging system 24 on screen 26, and this may be viewed through viewing port 28 located in a suitable part of the wall 2. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller 50 and displayed on a display device (not depicted), such as a flat panel display, for example. When not required, camera 30 can be retracted/withdrawn (as schematically indicated by arrows 30') so as to get it out of the way of axis 8'.

STEM recorder 32. An output from recorder 32 can be recorded as a function of (X,Y) scanning position of the beam 8 on the specimen S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis 8' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example (EELS=Electron Energy-Loss Spectroscopy).

It should be noted that the order/location of items 30, 32 and 34 is not strict, and many possible variations are conceivable. For example, spectroscopic apparatus 34 can also be integrated into the imaging system 24.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). Needless to say, the (schematically depicted) controller 50 may be (partially) inside or outside the enclosure 2, and may have a unitary or composite structure, as desired. The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis 8', taking the form of a small tube (e.g. of the order of 1 cm in diameter) through which the employed electron beam passes, but widening out to accommodate structures such as the source 4, specimen holder 10, screen 26, camera 30, recorder 32, spectroscopic apparatus 34, etc.

As before, the current invention concerns the manner in which—in STEM mode—the beam 8 is scanned with respect to the specimen S, which is held on holder 10 so as to show a presented surface to the beam 8. Once again, relative scanning motion of beam 8 and holder 10 can, in principle, be achieved in (a combination of) two different ways, namely:

By using scan deflector(s) 16 to move the beam 8 relative to the holder 10;
By using stage/actuator 12 to move the holder 10 relative to the beam 8.

The current invention uses a composite long-stroke+short-stroke motion, e.g. by using (for example) the controller 50 to generate complementary control commands for long-stroke and short-stroke scanning means, which may, for example, be embodied as follows:

Long-stroke scanning means: Scan deflector(s) 16, which may, for example, comprise current-carrying coils.
Short-stroke scanning means: Stage 12, which may, for example, comprise voice coil motors. Alternatively, one could make use of short-stroke electrostatic deflection plates in deflector 16, for instance.

The invention claimed is:

1. A scanning-type Charged Particle Microscope, comprising:
    a specimen holder, for holding a specimen;
    a source, for producing a beam of charged particles;
    an illuminator, for directing said beam so as to irradiate the specimen;
    a detector, for detecting a flux of radiation emanating from the specimen in response to said irradiation;
    scanning means, for producing relative scanning motion of the beam and specimen so as to cause the beam to trace out a scan path on the specimen; and
    a programmable controller configured to execute at least one scan path task in the microscope;
    wherein said scanning means comprises:
        long-stroke scanning means, for effecting scanning motion of relatively large amplitude and relatively low frequency; and
        short-stroke scanning means, for effecting scanning motion of relatively small amplitude and relatively high frequency; and wherein
    said controller is configured to generate and issue a series of periodic setpoints to said long-stroke and short-stroke scanning means to trace out a pre-determined scan path comprising relatively small-amplitude movements that are more than bidirectional, performed using said short-stroke scanning means, that combine into a resultant relatively large-amplitude migration, achieved with the aid of said long-stroke scanning means, wherein such scan path task bifurcation is complementary, cooperative, and embodies a piggyback approach between said long-stroke and short-stroke scanning means in which:
        high-speed, high-accuracy motion is conducted by the short-stroke scanning means in which associated relatively small-amplitude first field deflections are superimposed with periodicity upon relatively large-amplitude second field deflections; and
        said beam is subjected to these superimposed deflections thereby lowering susceptibility to overshoot or backlash from said pre-determined scan path.

2. A microscope according to claim 1, wherein:
    each of said long-stroke and said short-stroke scanning means is selected from the group consisting of electrostatic field deflectors, magnetic field deflectors and combinations hereof.

3. A microscope according to claim 1, wherein:
    one of said long-stroke and said short-stroke scanning means is selected from the group consisting of electrostatic field deflectors, magnetic field deflectors and combinations hereof;
    the other of said long-stroke and said short-stroke scanning means comprises a mechanical actuator for moving the specimen holder; and
    said scan path is achieved by a combination of beam deflection and specimen holder movement.

4. A microscope according to claim 1, wherein said controller is configured to trace out a scan path that is substantially a mathematical space-filling curve.

5. A microscope according to claim 4, wherein said controller is configured to trace out a scan path selected from the group consisting of a serpentine curve, a Hilbert curve, a Moore curve, a Z-order curve, a H-order curve, a Peano curve, an $AR^2W^2$ curve, a $\beta\Omega$ curve, and combinations hereof.

6. A microscope according to claim 1, comprising:
 a first detector with a relatively long characteristic response time, matched to a relatively low sampling frequency of the long-stroke scanning means;
 a second detector with a relatively short characteristic response time, matched to a relatively high sampling frequency of the short-stroke scanning means,
 which first and second detectors can be concurrently deployed to detect said radiation flux while said scan path is being traced out.

7. A microscope according to claim 6, wherein each of said first and second detectors can be invoked to detect a different species of radiation in said flux.

8. The microscope of claim 1, wherein the controller is further configured to:
 calculate a scan path to be traced out on an area of the specimen with a desired resolution and/or sparsity;
 deconvolve said scan path into complimentary long-stroke and short-stroke contributions;
 determine associated motions to be assigned to attendant long-stroke and short-stroke deflectors or stage actuators; and
 generate and issue the series of periodic setpoints to said long-stroke and short-stroke scanning means based on coordinate positions of sampling points on a particular space-filling curve that the controller desires to use as the ultimate scan path.

9. The microscope of claim 1, wherein the controller is further configured to generate a command signal to be sent to the scanning means, comprising a high-frequency signal superimposed over a low-frequency signal.

10. The microscope of claim 9, wherein the low-frequency signal is applied to the long-stroke scanning means and the high-frequency signal is applied to the short-stroke scanning means.

11. A method of using a scanning-type Charged Particle Microscope, comprising:
 providing a specimen on a specimen holder;
 directing a beam of charged particles from a source through an illuminator so as to irradiate the specimen;
 using a detector to detect a flux of radiation emanating from the specimen in response to said irradiation;
 using scanning means to produce relative scanning motion of the beam and specimen so as to cause the beam to trace out a scan path on the specimen,
 said scanning means comprising:
  long-stroke scanning means, for effecting scanning motion of relatively large amplitude and relatively low frequency;
  short-stroke scanning means, for effecting scanning motion of relatively small amplitude and relatively high frequency;
 constituting said scan path to comprise relatively small-amplitude movements that are more than bidirectional, performed using said short-stroke scanning means, that combine into a resultant relatively large-amplitude migration, achieved with the aid of said long-stroke scanning means, wherein: said scan path is pre-determined and set by a series of periodic setpoints generated by a programmable controller, configured to execute at least one scan path task, and issued by that controller to said long-stroke and short-stroke scanning means; and such scan path task bifurcation is complementary, cooperative, and embodies a piggyback approach between said long-stroke and short-stroke scanning means in which:
  high-speed, high-accuracy motion is conducted by the short-stroke scanning means in which associated relatively small-amplitude first field deflections are superimposed with periodicity upon relatively large-amplitude second field deflections; and
  said beam is subjected to these superimposed deflections thereby lowering susceptibility to overshoot or backlash from said pre-determined scan path.

12. A method according to claim 11, wherein said scan path is selected to be a sparse scan path.

13. A scanning-type Charged Particle Microscope, comprising:
 a specimen holder, for holding a specimen;
 a source, for producing a beam of charged particles;
 an illuminator, for directing said beam so as to irradiate the specimen;
 a first detector and a second detector, each for detecting radiation flux emanating from the specimen in response to said irradiation;
 scanning means, for producing relative scanning motion of the beam and specimen so as to cause the beam to trace out a scan path on the specimen; and
 a programmable controller configured to execute at least one scan path task in the microscope;
 wherein said scanning means comprises:
  long-stroke scanning means, for effecting scanning motion of relatively large amplitude and relatively low frequency; and
  short-stroke scanning means, for effecting scanning motion of relatively small amplitude and relatively high frequency; and wherein
 said controller is configured to generate and issue a series of periodic setpoints to said long-stroke and short-stroke scanning means to trace out a pre-determined scan path comprising relatively small-amplitude movements that are more than bidirectional, performed using said short-stroke scanning means, that combine into a resultant relatively large-amplitude migration, achieved with the aid of said long-stroke scanning means,
 wherein such scan path task bifurcation is complementary, cooperative, and embodies a piggyback approach between said long-stroke and short-stroke scanning means in which:
 high-speed, high-accuracy motion is conducted by the short-stroke scanning means in which associated relatively small-amplitude first field deflections are superimposed with periodicity upon relatively large-amplitude second field deflections;
 and wherein the first detector has a relatively long characteristic response time and is matched to a relatively low sampling frequency of the long-stroke scanning means, and the second detector has a relatively short characteristic response time and is matched to a relatively high sampling frequency of the short-stroke scanning means,
 which first and second detectors can be concurrently deployed to detect said radiation flux while said scan path is being traced out.

14. The microscope of claim 13 in which a first image assembled from said radiation flux detected by said first detector and a second image assembled from said radiation flux detected by said second detector are concurrently assembled without signal smearing despite the relatively long characteristic response time of the first detector differing from the relatively short characteristic response time of the second detector.

15. The microscope of claim 14 in which the ratio of the relatively long characteristic response time of the first detector to the relatively short characteristic response time of the second detector is a value chosen from the sequence 4, 16, 64, . . . $4^n$ where n is a non-negative integer.

* * * * *